United States Patent [19]
Kirihata et al.

[11] Patent Number: 5,561,636
[45] Date of Patent: Oct. 1, 1996

[54] RANDOM ACCESS MEMORY WITH A SIMPLE TEST ARRANGEMENT

[75] Inventors: Toshiaki Kirihata, Wappingers Falls; Yohji Watanabe, Fishkill, both of N.Y.

[73] Assignees: International Business Machines Corporation, Armonk, N.Y.; Kabushiki Kaisha Toshiba, Kawasaki, Japan

[21] Appl. No.: 613,800

[22] Filed: Mar. 1, 1996

Related U.S. Application Data

[63] Continuation of Ser. No. 346,966, Nov. 30, 1994.

[51] Int. Cl.$^6$ ..................................................... G11C 7/00
[52] U.S. Cl. ..................... 365/201; 365/200; 365/230.03
[58] Field of Search .................................. 365/200, 201, 365/230.03; 371/10.1, 10.2

[56] References Cited

U.S. PATENT DOCUMENTS

| | | | |
|---|---|---|---|
| 4,346,459 | 8/1982 | Sud et al. | 365/200 |
| 4,389,715 | 6/1983 | Eaton Jr., et al. | 365/200 |
| 4,656,610 | 4/1987 | Yoshida et al. | 365/200 |
| 4,660,179 | 4/1987 | Aoyama | 365/200 |
| 4,727,516 | 2/1988 | Yoshida et al. | 365/200 |
| 5,257,229 | 10/1993 | McClure et al. | 365/200 |
| 5,293,348 | 3/1994 | Abe | 365/230.03 |
| 5,301,155 | 4/1994 | Wada | 365/201 |
| 5,355,337 | 10/1994 | Kim | 365/201 |
| 5,355,339 | 10/1994 | Oh | 365/200 |
| 5,455,796 | 10/1995 | Inui | 365/201 |

FOREIGN PATENT DOCUMENTS

59-135700  3/1984  Japan.

*Primary Examiner*—A. Zarabian
*Attorney, Agent, or Firm*—Charles W. Peterson, Jr.

[57] ABSTRACT

A quick test Input/Output (I/O) Random Access Memory (RAM). The RAM array may be divided into individual units. Each unit is further divided into subarray blocks (blocks of subarrays). Each subarray or segment is organized by one and includes one spare column and may include spare word lines. When a block is accessed, only half of the segments are accessed. Whenever a segment is accessed, the segment's spare column is not. Data from columns in the accessed half and spare columns in the unaccessed half are transferred to Local Data Lines (LDLs) and from LDLs to Master Data Lines (MDLs). Valid data from accessed column lines and from selected spare lines are provided on the MDLS to second sense amplifiers. Defective columns are electrically replaced with spares after the second stage amplifiers. During Compression Mode test, the complementary outputs of several Second Sense amplifiers are wire AND'ed to each other and EXOR'ed. The wire ANDed Second Sense Amps are then enabled, simultaneously. After Compression Mode test, if one of the complementary wire AND'ed outputs is high and the other is low, the EXOR output will be high indicating no error was detected. Otherwise, the RAM fails self-test.

18 Claims, 8 Drawing Sheets

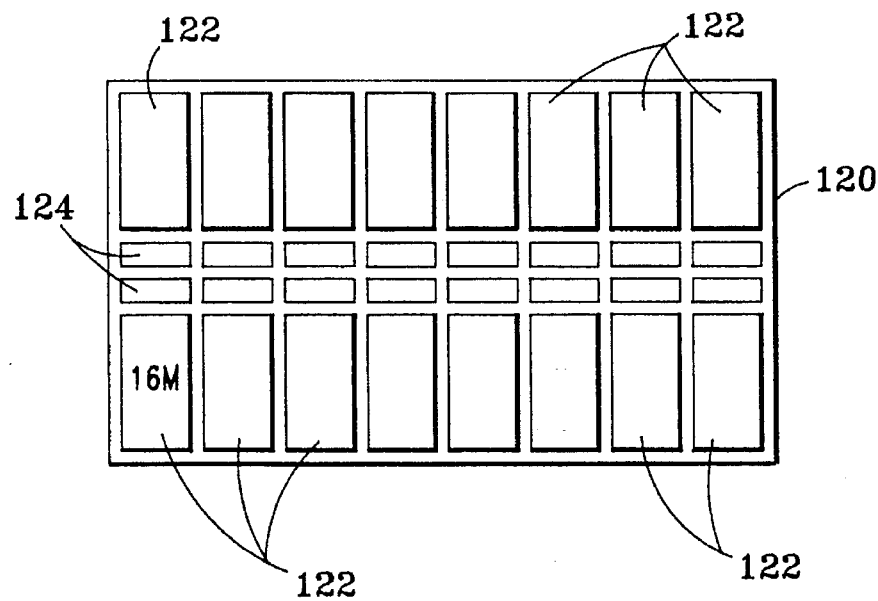
FIG. 2A
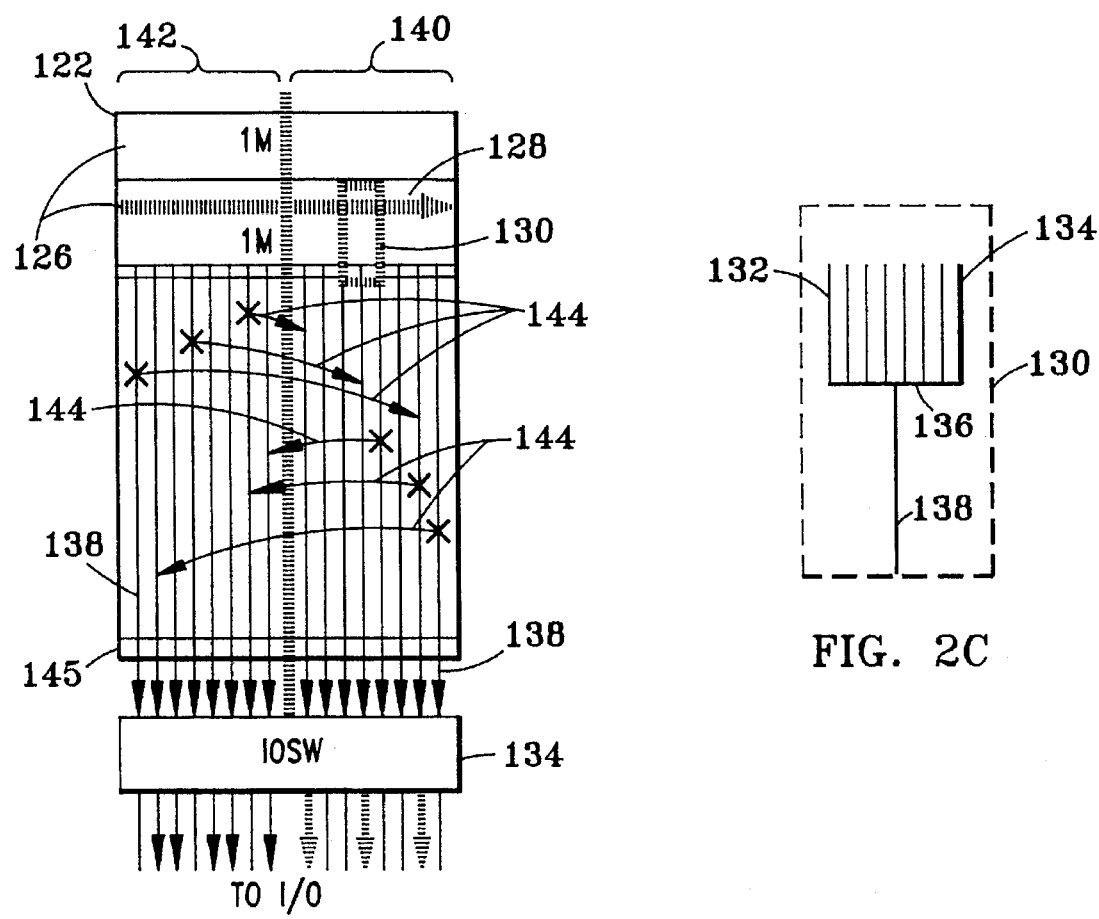
FIG. 2C
FIG. 2B

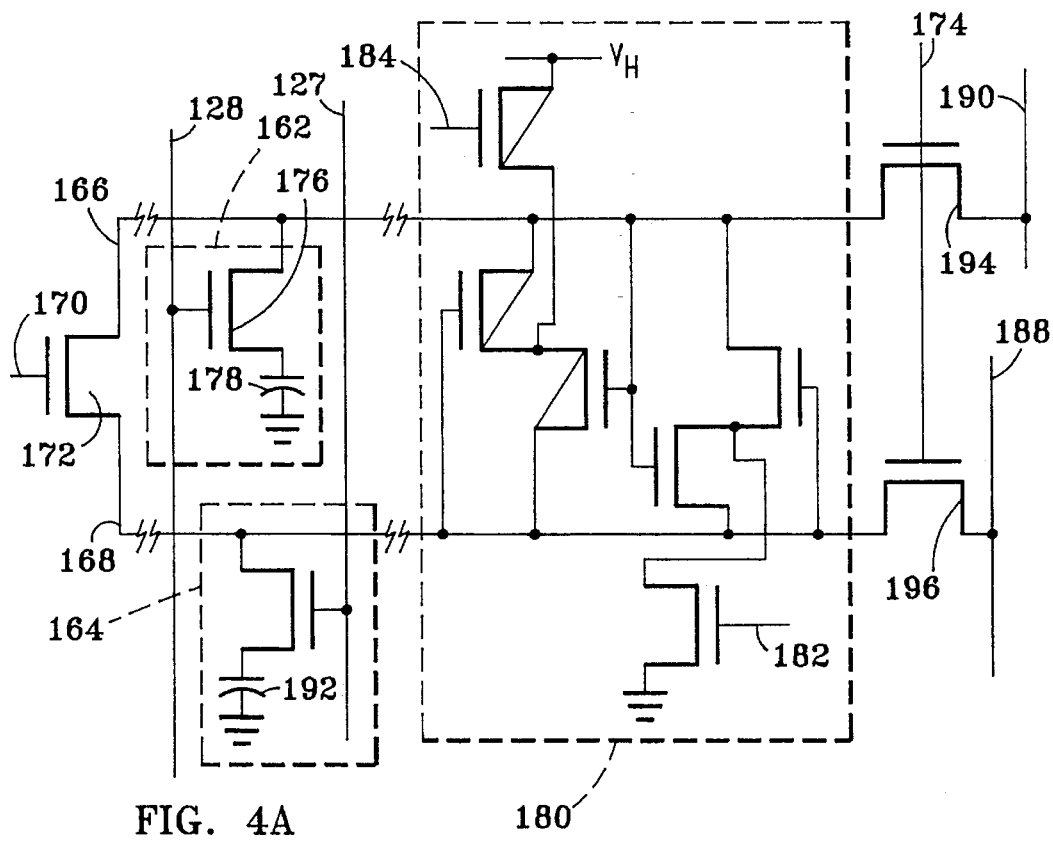
FIG. 4A
FIG. 4
| FIG. 4A |
| FIG. 4B |
| FIG. 4C |
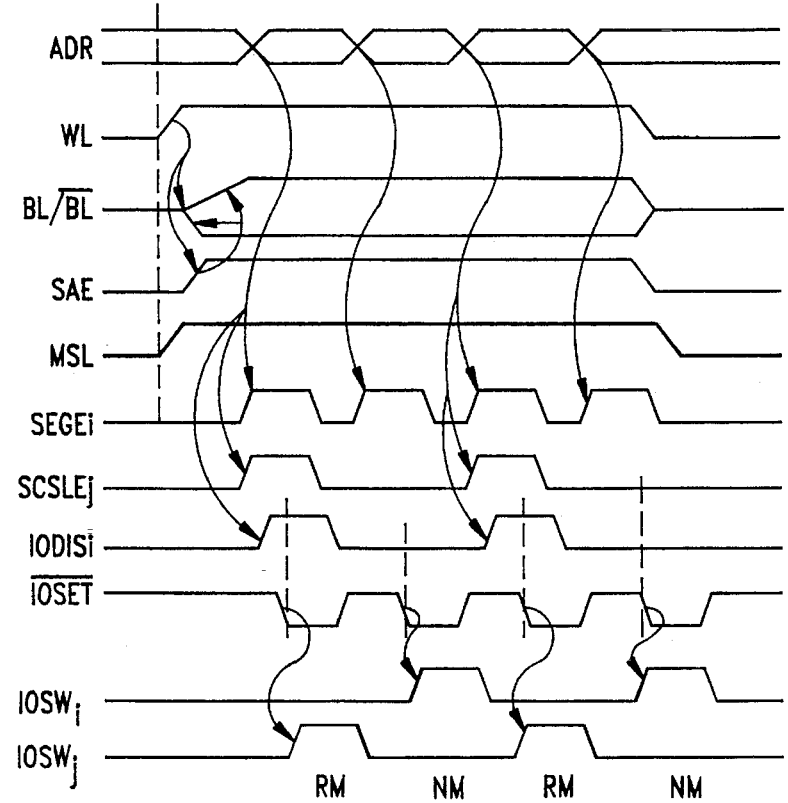
FIG. 4B

RANDOM ACCESS MEMORY WITH A SIMPLE TEST ARRANGEMENT

The application is a continuation, of application Ser. No. 08/346,966, filed Nov. 30, 1994.

RELATED APPLICATION

This application is related to application Ser. No. 08/346,965, to Kirihata, et al., entitled "A Random Access Memory Having A Flexible Array Redundancy Scheme", assigned to the assignee of the present invention and filed coincident herewith and incorporated herein by reference.

FIELD OF THE INVENTION

The present invention relates generally to semiconductor memories and more particularly testing semiconductor memories.

BACKGROUND OF THE INVENTION

Memory cell defects and memory array defects have many sources and, as a result, many signatures. While single, isolated cell failures may be spread throughout the array, very often, multiple cells in the same vicinity fail. When multi-cell failures occur, the failure may be characterized as a word line failure, (i.e. failing cells with the same word line address), a bit (or column) line failure (i.e. failing cells with the same bit address), or both. The sources of these multi-cell failures vary. In particular, bit line failures may be caused by open bit lines, shorted bit lines, missing field oxide, excess oxide, intercell leakage, or for various other reasons. Consequently, memory arrays are tested extensively to identify defective cells.

Very often, chips with defective cells can be repaired. Once identified, defective cells can be replaced, electrically, with spare cells, provided spare cells are included in the array. Providing on-chip spare cells to repair cell failures is known in the art as on-chip redundancy. A typical state of the art redundancy scheme has one or more spare rows (row redundancy) and/or one or more spare columns (column redundancy). These spare rows/columns have fuse programmable decoders that can be programmed to be responsive to the address of the defective row/column, while simultaneously disabling selection of the defective cell. Electrically, a repaired chip can not be discerned from a completely good chip.

Testing a memory chip to identify failed cells is complicated, requiring special test patterns, designed for identifying each type of failure. Because each of several test patterns must be written to and read from the array at least once, testing a memory chip can be time consuming. For example, on a 16 Mb RAM chip with a single (by one) Data In/Data Out (DI/DO) and an access time of 70 ns, testing a single test pattern on the over 16 million cells could take several seconds. Thoroughly exercising the array may take several minutes since testing requires many different test pattern variations. With hundreds of chips on a single semiconductor wafer, testing a single wafer may take hours. Furthermore, this testing is done more than once, at each step between the initial wafer screen (functional wafer test of each completed RAM site) and final shipment.

Additionally, test time increases as chips become denser, e.g. 64 Mb or 256 Mb. With each chip generation, density increases by a factor of four, i.e., 4×. Typically, that 4×increase corresponds to a 4×increase in addressable locations. However, each generation's performance improvement is usually less than 2×. So, with each generation, test time becomes longer and, therefore, even more of a problem.

For a variety of reasons, including a shortened array test time, these ultra dense RAMs are being organized with wide data paths of 32 bits (×32) or wider. This wide Input/Output (I/O) organization reduces array test time significantly because more cells are accessed during each cycle. Since more cells are accessed per cycle, fewer read/write cycles for each test pattern. For example, a single test pattern on a 64 Mb chip organized by 1 requires over 64 million write cycles to load the array and, then, 64 million read cycles, to verify that the array contains the stored test pattern. On the other hand, a wide I/O organization of 512 k×128 b, requires only 512 thousand write and 512 thousand read cycles, one read/write cycle for each 128 bits. Thus, a wide I/O organization, because it requires only a fraction of the number of test cycles, significantly reduces test time.

Besides reduced test time, modern system requirements provide additional impetus towards a wide I/O organization. State of the art microprocessors typically employ a 32 bit or 64 bit data word. A computer system architectured around one of these microprocessors usually requires 4–8 MBytes (MB) of Dynamic RAM (DRAM). 8 MB of memory for such a system, organized by 2 M by 32 can be made from four 16 Mb (2M×8) chips fairly simply. For example, a 2 M by 32 Single In-line Memory Module (SIMM) would use 4 chips 2M by 8 in parallel. However, a 64 Mb chip organized 8 M by 8 cannot be reconfigured so simply. Instead, a ×32 SIMM organization from an 8 M by 8 requires additional complex logic at a substantial loss in performance. However, a wide I/O organization provides the optimum 64 Mb chip organization for use in a typical state of the art microprocessor based system, whether organized 2 M by 32, 1M by 64 or 512 K by 128. In fact, a 512 k by 128 organization provides concurrent access to four 32 bit words simultaneously. Even as chip densities increase to 256 Mb and beyond, new wider word architectures, such as the Very Long Instruction Word (VLIW) architecture with instructions 256 bits wide or wider, are coming to the forefront.

Still another reason dense chips tend toward a wide I/O DRAM organization is the performance requirement for DRAMs used with high performance microprocessors. Typical prior art DRAMs cannot meet this performance requirement. One state of the art approach to increasing Synchronous DRAM (SDRAM) throughput is known as "Prefetch". A Prefetch architectured SDRAM has a wider on-chip data path than its off-chip I/O, e.g. 64 bit on-chip paths vs. 32 bit off-chip. All array (on-chip) operations occur simultaneously (i.e., 64 bit array reads and writes) with off chip transfers done sequentially, i.e. two 32 bit transfers. Consequently, because wide I/O RAMs reduce test time, simplify memory system design and improve RAM performance, wide I/O RAMs are needed.

Unfortunately, prior art redundancy techniques are inadequate for wide I/O RAMs. There are several prior art approaches to providing column redundancy in RAM chips. In one prior art approach, spare columns are isolated in a small (redundant) array. Whenever the column address points to a defective column, a preprogrammed one of the spare columns is selected from the redundant array instead. See, for example, U.S. Pat. No. 4,727,516 entitled "Semiconductor Memory Device Having Redundancy Means" to Yoshida et al. incorporated herein by reference. However, Yoshida's approach is slow and requires a significant amount of extra logic. The extra logic is needed to determine whether the column address is pointing to a defective column and, if so, to bypass the defective column and select the preprogrammed spare column. A delay must be added to cell access time to allow the redundancy detect logic to determine whether the column address is pointing to a defective column and, if so, to select the correct spare column instead. While this redundancy approach was acceptable for narrow I/O chips (<8 I/O), it is too slow, inflexible and cumbersome for use on wide I/O architecture.

Another redundancy approach is used when, as with denser arrays, the RAM array is organized hierarchically such that it is a group of smaller subarrays, e.g., the array might be divided into quadrants. In this second prior art redundancy approach, redundant columns are included with, and, dedicated to each subarray. Instead of substituting data from a separate subarray whenever a defective column is addressed, as in the first approach, a redundant column line within the subarray is selected.

FIG. 1 is a schematic representation of this second prior art redundancy scheme for a wide I/O, 16Mb DRAM chip. The chip 100 is organized with two Redundant Bit Lines (RBL) 102 and 104 providing two spare columns in each subarray 106. Each subarray 106 includes $2^n$ Bit Lines (BL) 108 (where n is typically between 5 and 8) and redundant bit lines (2 in this example). Each of the subarrays 106 is part of a subarray block 110. All of the subarray blocks 110, collectively, form the entire RAM array. So, for example, a 16 Mb RAM has 16 blocks 110 of 1 Mb each. Block size, subarray size and the number of subarrays 106 per block 110 are interdependent and, selected based on performance and logic objectives.

This second prior art redundancy approach is not as slow as the first, but it is also not as flexible either. With the first prior art approach, any spare column in the block of redundant columns could be substituted for any defective column. With this second prior art approach, defective columns can only be replaced by spare columns in the same subarray. So, there must be at least one spare column for each subarray just to insure full chip coverage. Although the coverage afforded by this second approach may provide for replacing more than two defective columns, i.e. in different subarrays, two spare columns per subarray 106 only guarantees that two defective columns per chip are repairable. Three defective columns in the same subarray 106 is unrepairable.

Furthermore, in addition to being inflexible, this second approach does not eliminate the redundancy related timing delay. A subarray 106 is accessed when one word line 112 is selected and driven high. Data from accessed cells are provided simultaneously to the bit lines 108 and redundant bit lines 102 and 104. After a predetermined minimum delay, sufficient to allow the redundancy decoder to determine whether a spare column is addressed, a single bit line 108 or a redundant bit line 102, 104 is selected in each subarray 106. In each subarray, the selected bit line 108 or redundant bit line 102, 104 is coupled to a Local Data Line (LDL) 114. LDLs 114 are coupled to Master Data Lines (MDLs) 116. The MDLs 116 couple corresponding subarrays 106 in each subarray block 110. Data is transferred between the subarrays 106 and the chip I/O's on the MDLs 116.

Normally, bit select logic is faster than redundancy decode logic. However, even if both circuits were equally fast, with this second approach, bit line selection would have to be delayed to avoid timing conflicts known as race conditions. When a race condition occurs, the spare bit line 102 or 104 and the defective bit line are, for a short period, both connected to the LDL simultaneously and, thereby, shorted together. Problems from race conditions vary from slowing data (i.e. sensing whether a "1" or was stored), to inadvertently switching data stored in the array or causing wrong data to be read or written. To avoid race conditions, prior to bit line selection, a slight delay must be added to the chip timing. While significantly smaller than the delay required using the first prior art approach, this slight delay still requires intentionally slowing chip access time to include redundancy. Slowing chip access is counter to the high performance objectives for most RAMs.

Besides being inflexible and slowing chip access, this second prior art redundancy scheme is inefficient. In the 16 Mb chip of the example above, for every $2^5=32$ bit lines 108, there are two redundant bit lines 102 and 104. At least 6.25% of the array area is dedicated to spare cells (this percent is higher if row redundancy is included). However, three defective columns in the same subarray 106 cannot be repaired, even though spare columns 102, 104 may remain unused in every other subarray 106. Thus, three defective columns in the same subarray renders an otherwise acceptable chip, unrepairable and, therefore, unusable.

Prior art redundancy schemes for wide I/O array chips are extensions of the above-described prior art schemes. These prior art redundancy schemes, which had limited advantages for narrow I/O RAMs, are inadequate for wide I/O RAMs or for prefetch type SDRAMs. As noted above, a wide I/O chip organization becomes even more necessary for ultra high density RAMs. Thus, there is a need for a wide I/O RAM architecture with flexible redundancy and improved test performance.

PURPOSES OF THE INVENTION

It is a purpose of the present invention to reduce semiconductor memory test time.

It is another purpose of the present invention to simplify semiconductor memory test.

It is yet another purpose of the present invention to reduce the time required to identify defective semiconductor memory chips.

It is yet another purpose of the present invention to simplify initial semiconductor memory chip test screening.

SUMMARY OF THE INVENTION

The present invention is a wide I/O Random Access Memory (RAM), architecture and self-test circuit therefor. If the RAM is large, it is divided into units. For each unit, or for smaller RAMs, the memory is further subdivided into blocks. The blocks are subdivided into memory segments. Each segment is arranged in rows and columns. Row and column selection is responsive to a memory address and is common for all segments in the block. Data from each column is double-sensed, first in a sense amplifier at the column and second in the unit by a second sense amplifier. The second sense amplifiers provide means for simultaneously self-testing several columns. In the preferred embodiment, the second sense amplifiers have complementary open collector outputs. The second sense amplifier outputs are ANDed together and the complementary result is EXOR'ed. The EXOR output provides a pass/fail self-test result.

BRIEF DESCRIPTION OF THE DRAWINGS

FIG. 2A is a floor plan of a wide I/O 256 Mb DRAM chip organized according to the preferred embodiment of the present invention.

FIG. 2B is a schematic representation of 16 Mb unit of the 256 Mb DRAM chip of FIG. 2A.

FIG. 2C is a schematic representation of a segment of the 16 MB unit of FIG. 2B.

FIG. 4A is a transistor level cross-sectional schematic of a segment organized according to the preferred embodiment of the present invention.

FIG. 4B is a timing diagram for the schematic of FIG. 4A.

TECHNICAL DESCRIPTION OF THE PREFERRED EMBODIMENT

Figure 1:
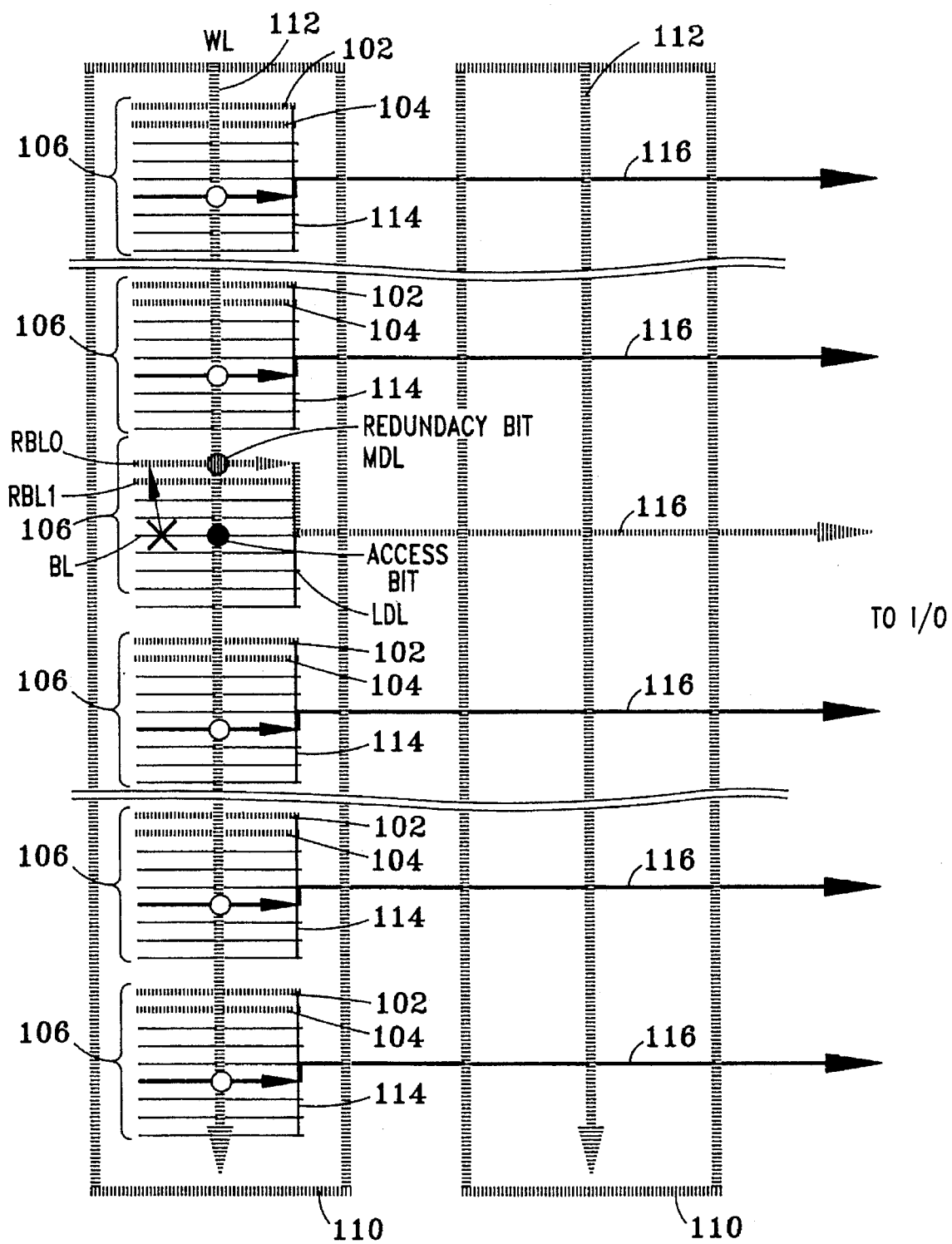
FIG. 1 is a schematic representation of a prior art redundancy scheme for a Wide I/O RAM.

FIG. 2A is a floor plan of a wide I/O 256 Mb DRAM chip 120 testable according to the preferred embodiment of the present invention. The 256 Mb array is divided into 16 equal 16 Mb units or array blocks 122.

FIG. 2B is a schematic representation of a single 16 Mb unit 122. As with the prior art 16 Mb RAM chip of FIG. 1, each 16 Mb unit 122 is divided into a plurality of blocks 126. A plurality of word lines 128 run horizontally through each subarray block 126. Each block 126 is divided further into a plurality of subarrays or segments 130. FIG. 2C is a schematic representation of a segment 130. Each segment 130 includes $2^n$ bit lines 132 and one spare column line 134. The terms "column" and "bit line" are used interchangeably herein and in the art and are intended to refer to a plurality of subarray cells with a common bit address in accordance with their normal meaning in the art. It should be noted that, in the present example, "bit line" actually refers to four complementary pairs of lines. For each complementary pair of lines, half of the cells are connected to one line with the remaining half are connected to the other line.

In the present example, there are two segments 130 per 4 unit DI/DOs for a total of 16 segments 130 in each block 126. Only half (8) of the segments 130 are accessed during any block access. Data from accessed segments 130 are passed to an I/O switch (IOSW) 124. The IOSW 124 redrives data, passing four bits from each accessed segment 130 to an I/O bus. Thus, the 256 Mb DRAM of FIG. 2A with sixteen 32 bit units 122 may be configured 512k by 512 for test and, if desired, for normal operation.

Continuing with the description of FIG. 2C, the bit lines 132 and spare column 134 in each segment 130 are selectively coupled to a Local Data Line (LDL) 136, also a complementary pair of lines. LDLs 136 from each subarray block 126 are coupled to MDLs 138, also a complementary pair of lines. The MDLs in each unit 122 are connected to a corresponding IOSW 124. In the preferred embodiment redundancy scheme, each block 126 is further divided into a right half 140 and left half 142. As noted above, during any array access, only half of the segments in any block are accessed, i.e. from the right half 140 or the left half 142. The half block with the accessed segments is the accessed half. The remaining (unaccessed) half block is designated the redundant half. The arrows 144 represent the spare columns 134 in one block half 140, 142 that are available to replace defective bit lines in segments 130 in the other block half 142, 140 respectively. Thus, instead of having a 1:1 spare to segment correspondence as for the second prior art scheme, i.e., only one spare bit line 134 available to replace a defective bit line in a segment 130, all eight spare bit lines 134 (from the redundant half block) are available. Optionally, each unit 122 may include a redundant word line block 145 to replace failed word lines.

Figure 3:
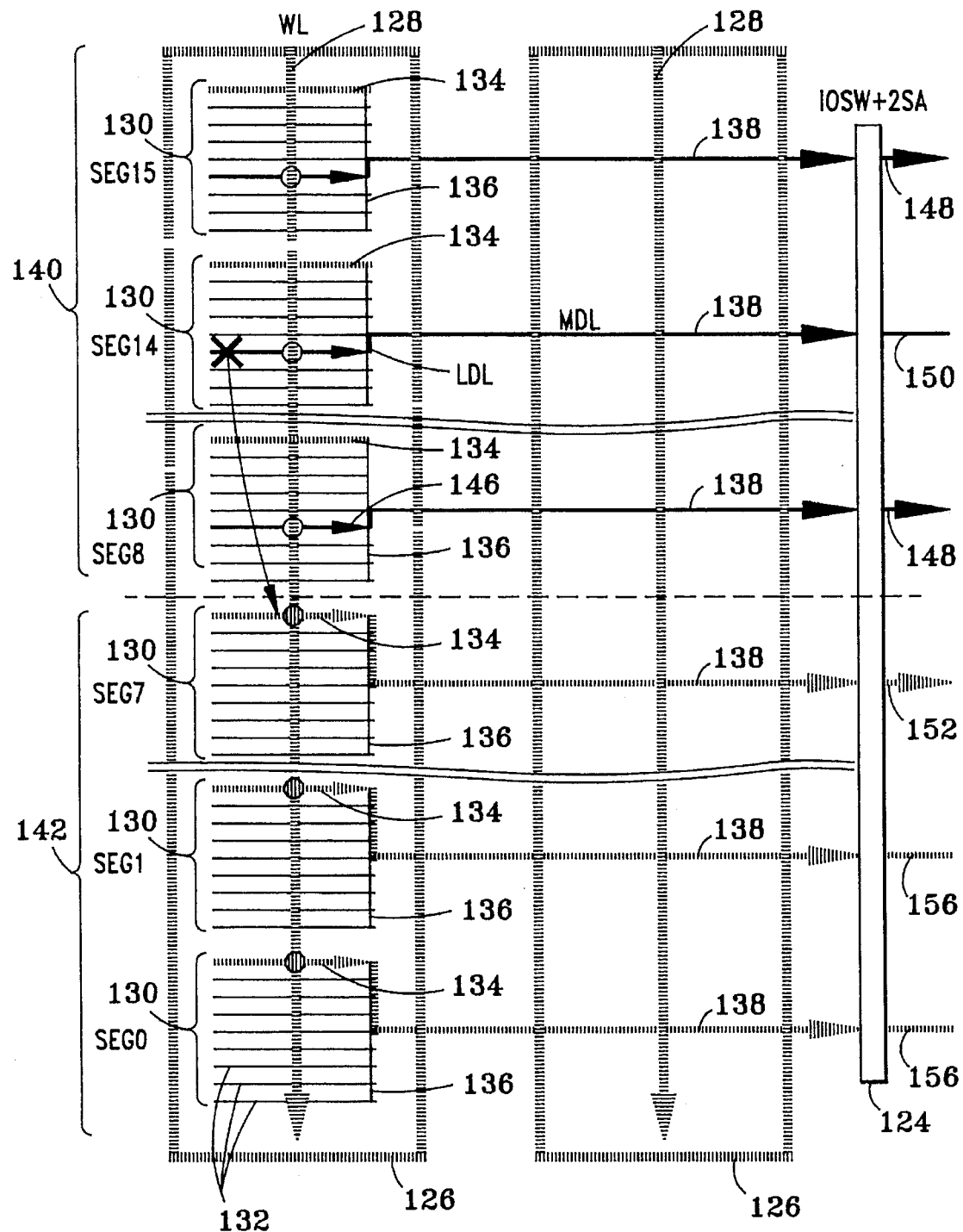
FIG. 3 is a cross-sectional schematic of 16Mb unit organized according to the preferred embodiment of the present invention.

FIG. 3 is an example of a unit organized according to the preferred embodiment of the present invention and in substantially the same level of detail as the prior art 16M chip of FIG. 1. In the example of FIG. 3, bit lines 132 in each segment 130 in the accessed right half 140 are accessed and, simultaneously, redundant bit lines 134 in segment 130 in the redundant left half 142 are accessed. Data is passed from the bit lines 132 (including defective bit line 146) in the accessed half 140 and redundant bit lines 134 in the redundant half 142 to LDLs 136. Data on the LDLs 136 are passed to corresponding MDLs 138. The IOSW circuit 124 selectively passes data from the MDLs 138 to I/O lines 148, 150, 152 and 156. Only valid data from each accessed half 140 is passed to I/O lines 148. Concurrently, the IOSW 124 blocks faulty data from defective bit lines 146, and, instead, passes valid data from a preprogrammed spare column 154 in redundant (left) half 142 to I/O line 152. IOSW 124 also blocks data from passing to remaining I/O lines 156.

In the example of FIG. 3, a single defective bit line 146 in the accessed half 140 is replaced, electrically, by a redundant bit line 134 from the redundant half block 142. However, as many as 8 failed bit lines each may be repaired anywhere in either half block 140, 142. Thus, instead of a single redundant bit line 134 per segment 130, several defective columns with a common bit address may be replaced by several spare columns 134. Alternatively, several defective columns in the same segment 130 may be replaced.

Bit, LDL 136 and MDL 138 selection can be better understood through the transistor level cross-sectional schematic of the array block of FIG. 3 as provided by FIG. 4. As noted above, in the preferred embodiment of the present invention, although represented as a single pair of lines in FIG. 4A, each bit line 132 is four complementary pairs of lines. Cells 162, 164 connected to adjacent word lines 127, 128 are connected to opposite lines 166, 168 of each pair. Thus, half of the word lines 128 (e.g., word lines with even addresses) select cells 162 on one 166 of the bit line pair. While the other half of the word lines 127, (odd addressed word lines) select the cells 164 on the other 168 of the bit line pair. A "one" is stored in the array such that it sets the sense amp in a predefined "one" condition. So, if a "one" is defined as 166 high and 168 low, then a "one" is stored in cell 162 (and all the other cells connected to 166) by charging the cell's storage capacitor 178 high. Conversely, a "one" is stored in 164 (and all other cells connected to 168) by completely discharging that cell's storage capacitor 192.

Operation of the circuit of FIG. 4A is according to the timing diagram of FIG. 4B. Prior to selecting a cell 162 or 164, the array is at its steady-state standby condition. The voltage on the bit line pair 166, 168 is equalized to $V_{DD/2}$, with the gate 170 of equalization transistor 172 held high. The Word Lines (WL) 127,128 and Column SeLect (CSL) lines 174 are held low during standby. When a word line 128 (or 127) is driven high, cell transistor 176 is turned on, in each cell 162 on the wordline 128, coupling the corresponding cell's storage capacitor 178 to line 166 of the complementary pair. The voltage on line 166 rises slightly if a charge is stored on storage capacitor 178 and falls slightly if no charge is stored there (i.e. the capacitor is discharged). The second line 168 of the complementary pair remains pre-charged to $V_{DD/2}$ and serves as a reference voltage for the Sense Amplifier 180. After sufficient delay that enough charge is transferred to sense "1" or "0" on line 166, the sense amplifier 180 is set. The sense amp is set by driving both the Sense Amp Enable (SAE) line 182 high and its inverse 184 low. After setting the sense amplifier, data transferred to the bit line pair 166,168 is amplified and redriven on the bit line pair, 166, 168 forcing them High/ Low or Low/High depending on data stored in the cell 162. Once all of the bit lines 166,168 have been redriven by the Sense Amplifier, SEGment Select signal ($SEG_1$) rises driving CSL 174 high to select a single column in each accessed segment 130. A high on CSL 174 connects the selected redriven bit line pair 166, 168 to the LDLs 188, 190 through pass gates 194, 196. CSL timing is substantially identical to $SEG_i$ but slightly delayed therefrom.

Simultaneously to driving CSL in the redundant half 142, if a defective column is addressed, Spare Column SeLect Enable (SCSLEj) rises driving Spare Column SeLect (SCSL) high (174 in the spare columns) and data from redundant column 134 is passed to the LDL pair 188, 190 through pass gates 194,196. SCSL going high drives Column SeLect Disable (CSLD) high, which, in turn, pulls concurrently driven CSL 174 low isolating the defective column from the LDLs 134. SCSL timing is substantially identical to SCSLEj but slightly delayed therefrom.

Figure 4C:
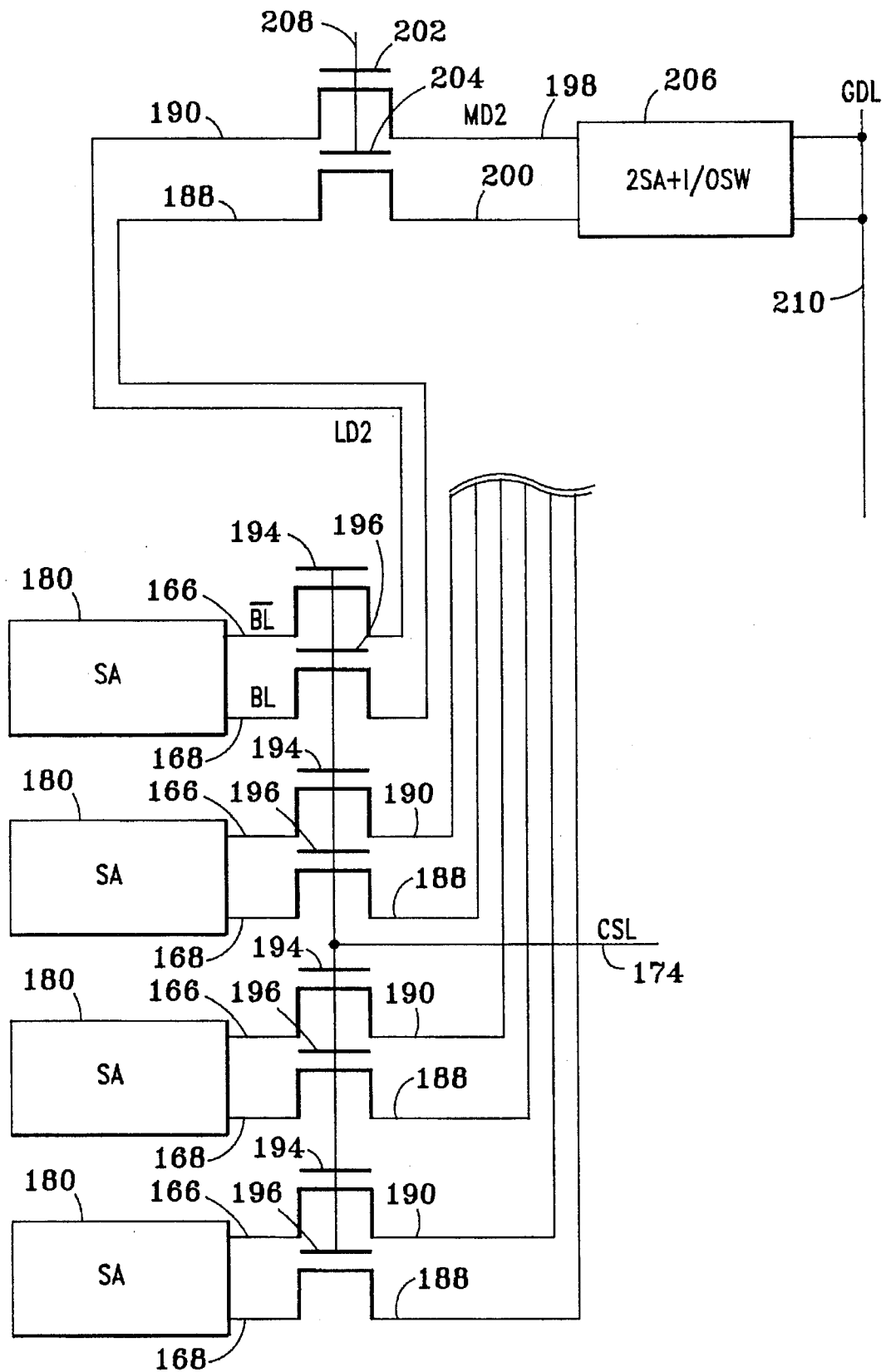
FIG. 4C is a schematic diagram of a column connection between the Sense Amp and the second Sense Amp.

Finally, in FIG. 4C, the LDL pair 188, 190 are connected to Master Data Line (pair 198, 200) through pass gates 202,204 by Master Data Select Line (MSL) 208. Data on MDL pair 198, 200 is re-sensed and re-driven through a second Sense Amp 206. As is further described in detail hereinbelow, each second sense amp 206 output is selectively coupled to a Global Data Line (GDL) 210, which is coupled to a chip I/O.

Figure 5A:
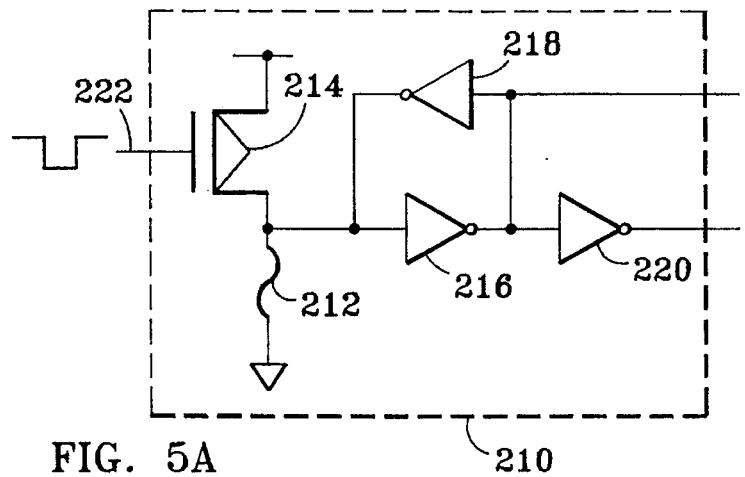
FIG. 5A is a schematic diagram of a programmable fuse latch circuit.

Programming the redundant column decoder can be better understood in view of FIG. 5A which is a schematic of a programmable fuse latch 210. The programmable fuse latch 210 includes a fuse 212 connected between ground and the drain of a P type FET (PFET) 214. The fuse provides a low resistance to clamp the input to inverter 216 low. With its input clamped low, inverter 216 passes a high to inverters 218 and 220. Inverters 216 and 218 form the latch. Inverter 220 reinverts the level from inverter 216. The outputs of the programmable fuse latch are from inverters 216 and 220. With the fuse removed (usually by laser programming), and the latch initialized by pulsing the gate 222 of the PFET 214 low, the output of inverter 220 is high and inverter 216 is low. Each segment has one programmable fuse latch for enabling the redundant column line and three for identifying the segment with the defective column line that the enabled redundant column line is to replace. The redundant column line enable level, FMAC, is the reinverted output of inverter 220. The three segment identification latches provide both true and complement outputs from inverters 220 and 216 labelled $FS_m$ and $\overline{FS}_m$, respectively, where $m$=0, 1 or 2. Use of these outputs is discussed in more detail below.

Figure 5B:
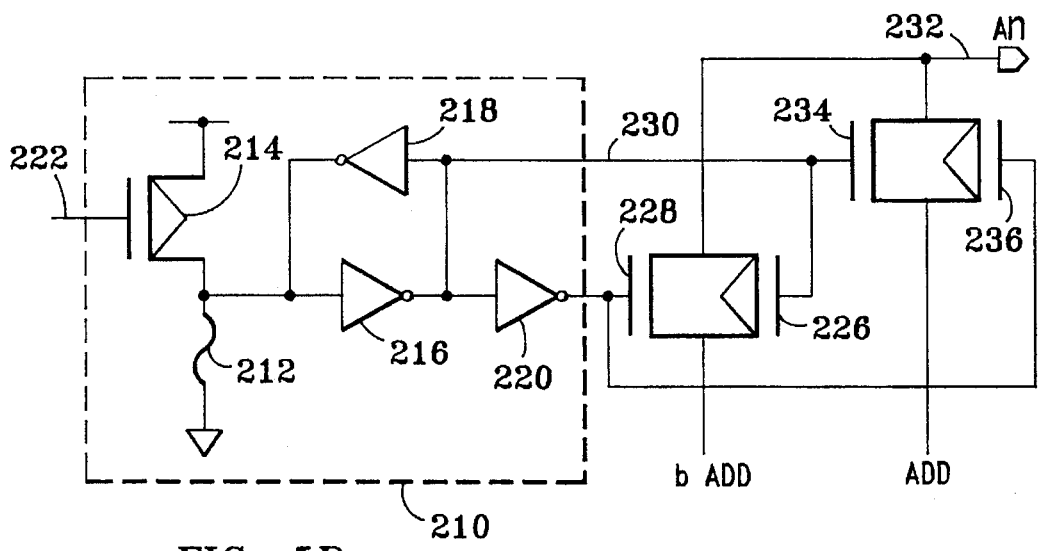
FIG. 5B is a schematic diagram of a programmable address selection circuit.

The programmable address selection circuit of FIG. 5B includes the programmable fuse latch 210 of FIG. 5A. The state of the fuse 212 selects the state of a 2:1 mux formed by complementary transistor pairs 222, 224 and 226, 228. With the fuse 212 in place, latch output 230 is high and buffer 220 output is low. Complementary pair 222 and 224 are turned on and complementary pair 226 and 228 are turned off. The 2:1 mux passes ADD (the uninverted address signal) to its output 232 ($A_n$) and blocks bADD (the complement of ADD). Conversely, with the fuse 212 removed, latch output 230 is low and buffer output 220 is high. Complementary pair 226 and 228 are turned on and complementary pair 222 and 224 are turned off. In this state, the mux passes bADD to its output 232 and blocks ADD.

Figure 5C:
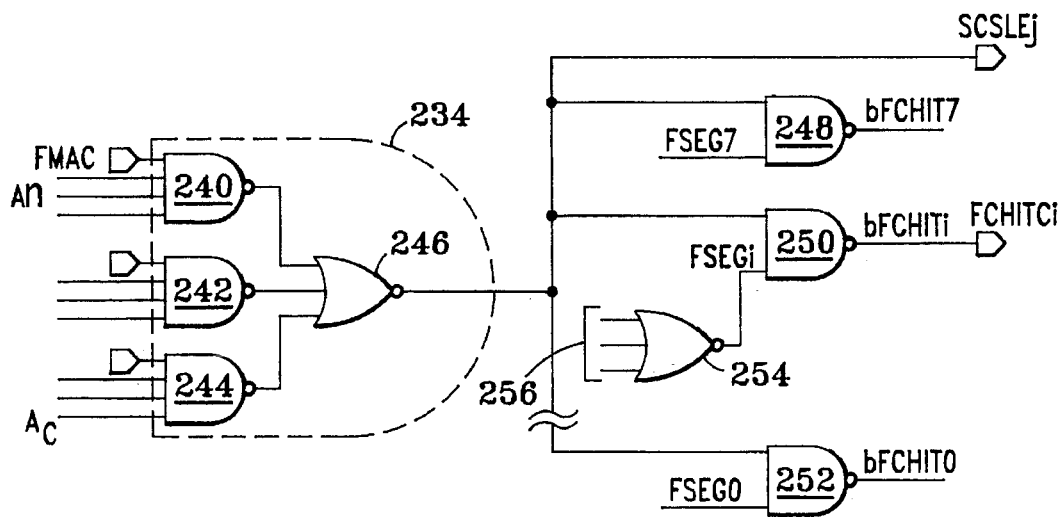
FIG. 5C is a schematic diagram of a CRDN circuit.

FIG. 5C is a schematic diagram of a CRDN circuit of the preferred embodiment of the present invention. NAND gates 240, 242 and 244 in combination with NOR gate 246 decode the fuse programmed address by logically AND'ing programmable address selection outputs Ao–An ($n$=9) with programmable latch output FMAC. FMAC, the output of a programmable fuse latch 210, is high if the fuse 212 has been blown enabling CRDN. The decoder output of NOR gate 246 is Segment Column SeLect Enable (SCSLEj) for segment number j, where j is between 0 and 7. SCSLEj goes high only if FMAC is high, i.e. CRDN has been enabled, and Ao–An are driven high when the programmed address is accessed. AO–An are high based on the state of fuses 212 in each respective programmable address selection circuit and the column address. Thus, spare column selection is programmed by removing (or blowing) fuses to force FMAC high and to provide Ao–An as highs upon addressing a defective column. SCSLEj is driven high when the programmed address (of a defective column) is accessed. Each segment includes a dedicated CRDN circuit. Therefore, accessing a spare column is faster than prior art approaches and array bit line access occurs coincident with and simultaneous to spare column access.

So, if SCSLE goes high, the spare column has been enabled to replace a single defective column in the accessed half 140. The segment containing the defective column to be replaced is identified by $FSEG_i$. $FSEG_i$ is the output of NOR gate 254. The inputs 256 to NOR gate 254 (which is representative of eight NOR gates) are $FS_m$ or $\overline{FS}_m$ NOR gates 254 effect a ⅛ decode of the three inputs that results in one $FSEG_{0-7}$ high. The high $FSEG_{0-7}$ indicates that the spare column has been fuse programmed to replace a defective column in Segment 0–7 respectively. NAND gates 248, 250 and 252 represent eight NAND gates (one for each accessed segments). When SCSLE goes high, the spare column is accessed. One of $bFCHIT_1$ falls indicating that there is a HIT (a match) on a Fused Column for the segment identified by $FSEG_i$.

Figure 6A:
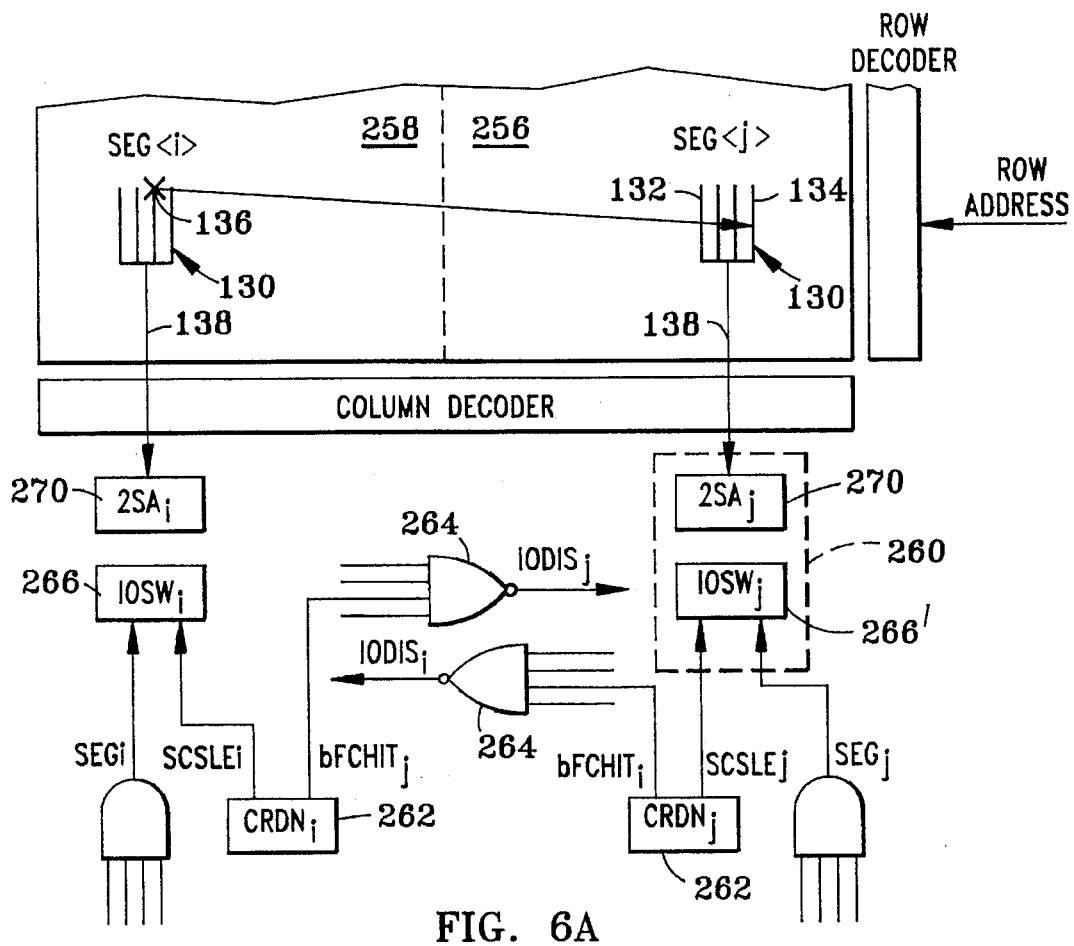
FIG. 6A is a schematic cross section of a unit through the IOSW circuit.
Figure 6B:
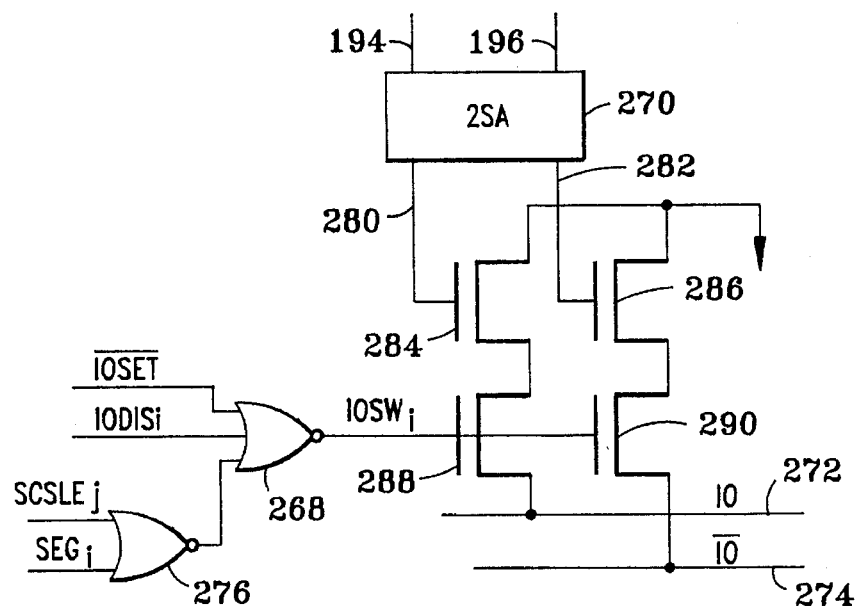
FIG. 6B is a schematic diagram of the IOSU circuit.

FIG. 6A is a schematic cross section of a unit 122 through the IOSW circuit 124, including logic for substituting a spare column 134 for a defective column 136. In the cross section of FIG. 6A, decode logic is included for both the redundant half 256 and for the accessed half 58. The CRDN circuit of FIG. 5C is represented by logic block 262. Upon addressing a fuse selected-spare column, sending $bFCHIT_{0-7}$ low in the redundant half 256, I/O DISable ($IODIS_i$) is driven high by NAND gate 264. $IODIS_i$ is a segment output from the segment that includes the selected redundant column and is an input to the IOSW logic 266 for the defective column segment. A high on $IODIS_i$ disables the output of the second sense amp 270 in the defective accessed segment by forcing the $IOSW_i$ signal low, i.e., the output of NOR gate 268. The $IOSW_1$, when enabled, selectively couples the contents of the Second Sense Amp 270 to I/O complementary pair 272, 274. IOSW$_1$ is also controlled by timing signal $\overline{\text{IOSET}}$ and, through NOR gate 276, by both SEG$_i$ and SCSLEj.

Data on MDL 138 is provided on complementary pair 194, 196, as indicated above, to Second Sense Amp 270. When Second Sense Amp 270 is set, it passes re-driven data out on complementary pair 280, 282 turning on either of FETs 284, 286. I/O complementary pair 272, 274 are precharged high. Driving IOSW$_1$ high turns on FETs 288, 290 coupling FETs 284 and 286 to complementary lines 272 or 274 respectively. One of lines 272 or 274 is pulled low through 284,288 or 286,290 respectively, depending on the state of the Second Sense Amp. Data thus transferred from the array to I/O line pair 272,274 is passed off chip.

Figure 7:
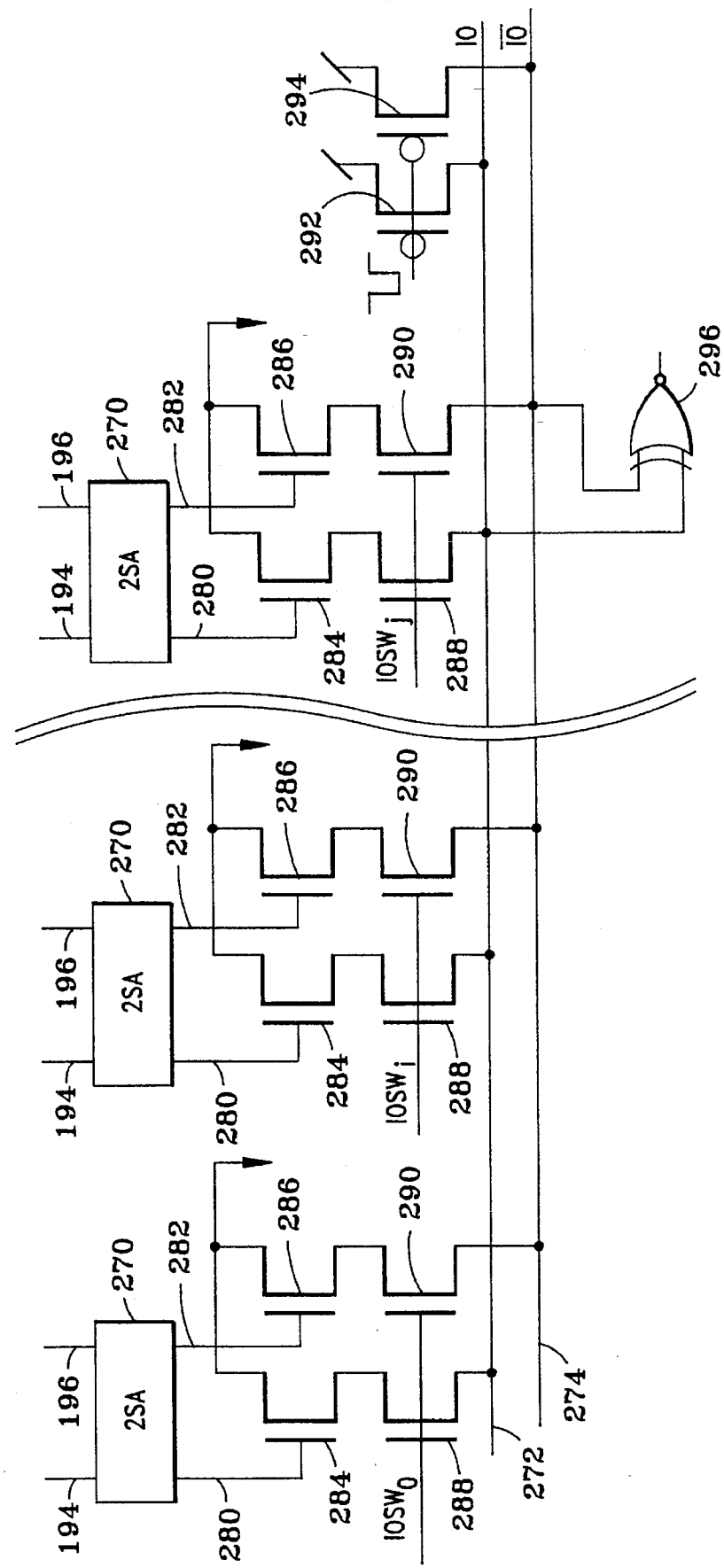
FIG. 7 is a schematic diagram of a compression mode test configuration.

As shown in FIG. 7, in a RAM chip organized according to the preferred embodiment of the present invention, each unit 122 has 8 Second Sense Amp 270 outputs (0–7) from the redundant half. Each redundant half Second Sense Amp 270 output is dotted (dot AND'ed) to the output of a Sense Amp 270 on the accessed side at an IO complementary pair 272, 274. Pulsing the gates of PFETs 292, 294 pulls IO complementary pair 272, 274 high. A quick, simple array test can be performed on a chip with this organization. This test, referred to hereinafter as the "data compression mode" test, provides a convenient initial screen to determine whether further all of the cells in a segment might be good. Data compression mode testing is done first by filling the array with a predetermined pattern, e.g. all ones or all zeros. Then, cycling through the word and column addresses to access each tested cell. At each address, all IOSW's are set high, coupling all Second Sense Amp 270 Outputs together on the I/O lines 272,274. If on each I/O pair 272,274, one line remains high and one line goes low, no error was detected. If, however, both lines go low, at least one defective cell was detected. Further, an Exclusive OR (EXOR) gate 296 with I/O lines 272,274 as inputs provides sufficient Go, No Go test logic. A "1" at the EXOR output is a pass (Go) and a "0" is a fail (No Go). While data compression mode testing does not detect every defective cell, it accelerates the RAM test significantly. Thus, the RAM organization of the present invention is significantly easier to test the prior art organization.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A Random Access Memory (RAM) comprising:
 a memory array comprising:
  a plurality of memory segments, each said segment including a plurality of memory cells arranged in rows and columns, each of said columns including a first sense amplifier, each said memory segment including a plurality of second sense amplifiers, each said second sense amplifier being selectively coupled to a plurality of said first sense amplifiers,
  row selection means for selecting each row of said memory cells in at least two of said segments simultaneously according to a row address, and
  column selection means for selecting each column from said columns in each said segment according to a column address; and
  means for simultaneously testing a plurality of cells in a plurality of rows of each said segment comprising:
   means for selectively coupling together said second sense amplifiers to provide a pair of test lines, and
   means for comparing said pair of test lines.

2. The RAM of claim 1 wherein each of said plurality of second sense amplifiers has dottable output and
 each of said dottable outputs being coupled to at least one other of said dottable outputs.

3. The RAM of claim 2 wherein said means for simultaneously testing a plurality of cells wherein two or more dottable outputs being dotted together forms a global data line and further comprising an active precharge load connected to each said global data line.

4. The RAM of claim 1 wherein each said column is one or more complementary pairs of lines, one memory cell in each said row being connected to each complementary pair of lines.

5. The RAM of claim 4 wherein said one or more complementary pairs of lines is four pair.

6. The RAM of claim 4 wherein half of said memory cells in each said row are connected to one line of said complementary pair of lines and the other half is connected to the other of said complementary pair of lines.

7. The RAM of claim 3 wherein the memory array further comprises a plurality of subarray blocks each said subarray block including a plurality of said memory segments.

8. The RAM of claim 7 wherein said row selection means selects one of said plurality of subarray blocks and one row in said selected subarray block, said selected row being common to all of said memory segments of said selected subarray block.

9. The RAM of claim 8 further comprising a plurality of array blocks, each said array block including at least two of said plurality of subarray blocks.

10. A Random Access Memory (RAM) comprising:
 a plurality of array units, each of said plurality of array units comprising a plurality of subarray blocks, each of said plurality of subarray blocks comprising a plurality of segments, each of said plurality of segments comprising:
  a plurality of memory cells arranged in a two-dimensional addressable array of rows and columns and including at least one spare column, each said column including a first sense amplifier,
  and a plurality of second sense amplifiers, each said second sense amplifier being selectively coupled to a plurality of said first sense amplifiers;
 row selection means for selecting each of said rows responsive to a row address;
 column selection means for selecting each column in every segment in a subarray block responsive to a column address; and
 means for simultaneously testing a plurality of cells in a plurality of rows in each of said plurality of segments comprising:
  means for selectively coupling together said second sense amplifiers to provide a pair of test lines, and
  means for comparing said pair of test lines.

11. The RAM of claim 10 wherein said plurality of second sense amplifiers have dottable complementary outputs, and
 each of said dottable outputs being coupled to dottable outputs of another of said second sense amplifiers.

12. The RAM of claim 10 wherein said means for simultaneously testing a plurality of cells wherein two or more dottable outputs being dotted together forming a global data line and further comprising:
 an active precharge load connected to each said global data line.

13. The RAM of claim 10 wherein each said column is one or more complementary pairs of lines, one memory cell in each said row being connected to each complementary pair of lines.

14. The RAM of claim 13 wherein said one or more complementary pairs of lines is four pair.

15. The RAM of claim 10 wherein half of said memory cells in each said row are connected to one line of said complementary pair of lines and the other half is connected to the other of said complementary pair of lines.

16. The RAM of claim 12 wherein said global data line is a complementary pair of lines and further comprising:
   an exclusive OR receiving said global data complementary pair of lines and providing a "go/no go" signal.

17. A Random Access Memory (RAM) comprising:
   a memory array comprising:
      a plurality of memory segments, each said segment arranged in rows and columns, each of said columns including a first sense amplifier,
      at least one spare column in each said plurality of memory segments,
      a plurality of a second sense amplifiers in each of said plurality of memory segments, each said second sense amplifier being selectively coupled to a plurality of said first sense amplifiers,
   row selection means for selecting each row of memory cells in at least two of said segments simultaneously according to a row address, and
   column selection means for selecting each column from said columns in each said segment and for selecting a half of said at least two memory segments according to a column address, said selected half being an accessed half and an unselected half being a redundant half;
   redundancy selection means for selecting at least one said spare column from said redundant half when a predetermined defective column is selected in said accessed half;
   substitution means for electrically substituting said selected spare column for said predetermined defective column; and
   means for simultaneously testing a plurality of cells in a plurality of rows of each said segment comprising:
      means for selectively coupling together said second sense amplifiers to provide a pair of test lines, and
      means for comparing said pair of test lines.

18. A Random Access Memory (RAM) comprising:
   a plurality of array units, each of said plurality of array units comprising a plurality of subarray blocks, each of said plurality of subarray blocks comprising a plurality of segments, each of said plurality of segments comprising a plurality of memory cells arranged in a two-dimensional addressable array of rows and columns and including at least one spare column, each said column including a first sense amplifier and a plurality of second sense amplifiers, each said second sense amplifier being selectively coupled to a plurality of said first sense amplifiers;
   row selection means for selecting each of said rows responsive to a row address;
   column selection means for selecting either half of a subarray block as an accessed half or as a redundant half and for selecting each of said columns in every segment in said accessed half responsive to a column address;
   redundancy selection means for selecting one said spare column from said redundant half for each predetermined bad column selected in said accessed half;
   substitution means for electrically substituting said selected spare column for each said predetermined bad column; and
   means for simultaneously testing a plurality of cells in a plurality of rows of each said segment comprising:
      means for selectively coupling together said second sense amplifiers to provide a pair of test lines, and
      means for comparing said pair of test lines.

* * * * *